United States Patent
Iwasaki et al.

(10) Patent No.: US 11,164,841 B2
(45) Date of Patent: Nov. 2, 2021

(54) SEMICONDUCTOR DEVICE

(71) Applicant: DENSO CORPORATION, Kariya (JP)

(72) Inventors: Shingo Iwasaki, Toyota (JP); Keita Hatasa, Nisshin (JP); Satoshi Takahagi, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/672,581

(22) Filed: Nov. 4, 2019

(65) Prior Publication Data
US 2020/0185348 A1 Jun. 11, 2020

(30) Foreign Application Priority Data
Dec. 7, 2018 (JP) .............................. JP2018-229947

(51) Int. Cl.
*H01L 23/00* (2006.01)
*H01L 23/492* (2006.01)
*H01L 23/31* (2006.01)

(52) U.S. Cl.
CPC .......... *H01L 24/32* (2013.01); *H01L 23/3107* (2013.01); *H01L 23/4924* (2013.01); *H01L 24/83* (2013.01); *H01L 2224/32245* (2013.01); *H01L 2224/83801* (2013.01)

(58) Field of Classification Search
CPC ..... H01L 23/49575; H01L 2224/83815; H01L 24/32; H01L 24/29; H01L 24/33; H01L 23/49537; H01L 23/3107; H01L 2224/83801; H01L 23/49542; H01L 23/49551; H01L 24/83; H01L 23/4924; H01L 2224/32245; H01L 23/49568; H01L 2924/13055; H01L 2924/13091; H01L 2224/29347; H01L 23/49562
See application file for complete search history.

(56) References Cited

U.S. PATENT DOCUMENTS

| 2005/0093131 | A1 | 5/2005 | Nakase et al. |
| 2019/0103340 | A1* | 4/2019 | Tsuchimochi ...... H01L 23/3121 |
| 2020/0303360 | A1* | 9/2020 | Tokuyama .............. H02M 7/48 |

FOREIGN PATENT DOCUMENTS

JP 2005-136018 A 5/2005

* cited by examiner

*Primary Examiner* — Jasmine J Clark
(74) *Attorney, Agent, or Firm* — Sughrue Mion, PLLC

(57) ABSTRACT

A semiconductor device may be provided with a first member, a second member joined to a first region of the first member via a first solder layer and a third member joined to a second region of the first member via a second solder layer. The first region and the second region are located on one side of the first member. The first solder layer contains a plurality of support particles that is constituted of a material having a higher melting point than the first solder layer. The second solder layer does not contain any support particles.

10 Claims, 3 Drawing Sheets

SEMICONDUCTOR DEVICE

CROSS-REFERENCE TO RELATED APPLICATIONS)

This application claims priority to Japanese Patent Application No. 2018-229947, filed on Dec. 7, 2018, the entire contents of which are incorporated herein by reference.

TECHNICAL FIELD

The technology disclosed herein relates to a semiconductor device.

BACKGROUND

Japanese Patent Application Publication No. 2005-136018 discloses a semiconductor device. In this semiconductor device, a plurality of members including a semiconductor element is joined together via solder layers. Each of the solder layers contains support particles that are constituted of a material having a high melting point so as to ensure a minimum thickness thereof.

SUMMARY

In manufacturing of a semiconductor device, there may be a case where two or more members are simultaneously soldered to a single member. In such soldering, if solder materials respectively contain support particles, solder layers may have nonuniform thicknesses against expectations. For example, if any of the members has dimensional or positional deviation, the thicknesses of the solder layers usually vary passively in accordance with the dimensional or positional deviation, so that the deviation can be cancelled out. However, if the solder materials respectively contain their support particles, the solder materials respectively maintain their minimum thicknesses. Consequently, the single member is joined in a tilted posture to the two or more members, resulting in nonuniform thicknesses of the solder layers.

The present specification provides a technology capable of solving at least partially such a problem and improving quality of a manufactured semiconductor device.

The technology disclosed herein is embodied by a method of manufacturing a semiconductor device. This manufacturing method may comprise: placing a second member above a first region of a first member via a first solder material and placing a third member above a second region of the first member via a second solder material, the first region and the second region being located on one side of the first member (i.e., a side where the first region is located); and soldering the second member and the third member to the one side of the first member by melting the first solder material and the second solder material. The first solder material contains a plurality of support particles that is constituted of a material having a higher melting point than the first solder material, and the second solder material does not contain any support particles. Here, each of the first member, the second member, and the third member may be or may not be a semiconductor element. In other words, the semiconductor device may further include a semiconductor element, aside from the first member, the second member, and the third member.

According to the above-described manufacturing method, if any of the members has dimensional or positional deviation, a thickness of the melted second solder material can vary in accordance with the deviation. On the other hand, the first solder material has the support particles maintain a minimum thickness thereof. The first member is thereby joined, not tilting but being in a correct posture relative to the second and third members. Therefore, not only the first solder material between the first member and the second member, but also the second solder material between the first member and the third member, can be maintained to have a relatively uniform thickness.

The above-described manufacturing method embodies a novel and useful semiconductor device. This semiconductor device may comprise: a first member; a second member joined to a first region of the first member via a first solder layer, the first region being located on one side of the first member; and a third member joined to a second region of the first member via a second solder layer, the second region being located on the one side of the first member (i.e., a side where the first region is located). The first solder layer contains a plurality of support particles that is constituted of a material having a higher melting point than the first solder layer, and the second solder layer does not contain any support particles.

In the above-described semiconductor device, only the first solder layer, out of the first solder layer and the second solder layer, contains the support particles. According to such a configuration, when the semiconductor device is to be manufactured, the first member can be joined not tilting but in a correct posture to the second and third members. Each of the first solder layer and the second solder layer is thereby formed to have a relatively uniform thickness. Allowing each of solder layers to have a uniform thickness reduces concentration of internal stress that takes place with thermal deformation, for example, so that a semiconductor device can achieve superior durability.

DETAILED DESCRIPTION

Figure 1:
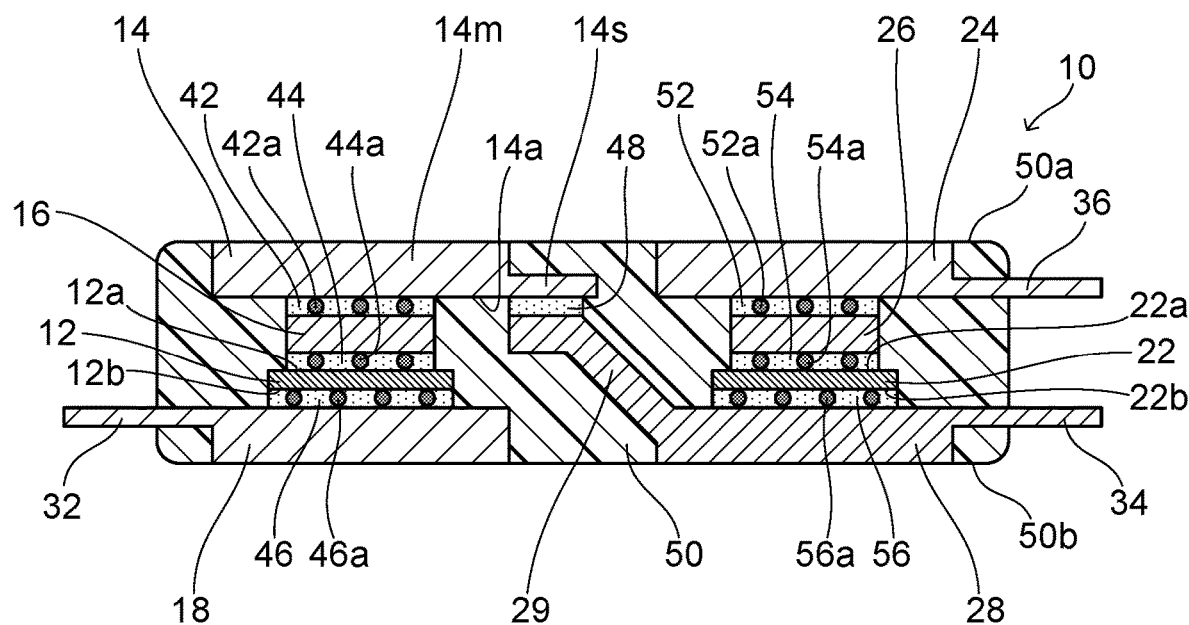
FIG. 1 is a cross-sectional view schematically showing a structure of a semiconductor device 10 in an embodiment.

In one aspect of the manufacturing method according to the present technology, in the soldering of the second member and the third member, the first member may be attracted to the second member and the third member by surface tensions of the melted first solder material and the melted second solder material such that the plurality of support particles makes contact with both the first member and the second member. A distance between the first member and the second member, in other words, a thickness of the first solder layer is more easily maintained to be uniform by the plurality of support particles.

According to the above-described aspect, in the manufactured semiconductor device, the plurality of support particles in the first solder layer is in contact with both the first member and the second member.

In one aspect of the manufacturing method according to the present technology, an area of the first region with which the first solder material is in contact may be greater than an area of the second region with which the second solder material is in contact. According to such a configuration, the surface tension of the melted first solder material attracts the first member more strongly than the surface tension of the melted second solder material does. Since the first solder material contains the plurality of support particles, the first solder material strongly attracts the first member, so that the posture of the first member is stabilized relative to the second and third members.

According to the above-described aspect, in the manufactured semiconductor device, the area of the first region where the first solder layer is in contact with the first member is greater than the area of the second region where the second solder layer is in contact with the first member.

In one aspect of the manufacturing method according to the present technology, in the soldering of the second member and the third member, in a view perpendicular to the first region, a center of gravity of the first member may be located within the first region. According to such a configuration, when the melted first and second solder materials attract the first member, the plurality of support particles contained in the first solder material makes contact with the first member near that center of gravity, so that the posture of the first member is stabilized relative to the second and third members.

According to the above-described aspect, in the manufactured semiconductor device also, in the view perpendicular to the first region, the center of gravity of the first member is located within the first region.

In one aspect of the semiconductor device or the method of manufacturing the same according to the present technology, a normal vector of the first region may be parallel with a normal vector of the second region. Additionally, the first region and the second region may be located on a same plane. It should be noted that, as another aspect, the first region and the second region may not be located on the same plane, and their normal vectors may form a slight angle (e.g., 10 degrees or less).

In one aspect of the semiconductor device or the method of manufacturing the same according to the present technology, the plurality of support particles may be constituted of a metallic material. In this case, the plurality of support particles may be constituted of nickel (Ni) or copper (Cu), but is not particularly limited thereto. Allowing the support particles to be constituted of a metallic material can maintain or enhance electrical conductivity of the first solder layer. It should be noted that, as another aspect, some or all of the plurality of support particles may be constituted of insulator or semiconductor.

In one aspect of the semiconductor device or the method of manufacturing the same according to the present technology, the semiconductor element may be joined to the second member via a third solder layer at an opposite side from the first solder layer. In this case, the third solder layer may contain a plurality of support particles that is constituted of a material having a higher melting point than the third solder layer. According to such a configuration, the first solder layer and the third solder layer, each of which is placed on the semiconductor element in a superposed manner, are formed to have uniform thicknesses by their support particles, respectively. Due to this, concentration of internal stress that takes place with thermal deformation, for example, is thereby effectively suppressed especially in a vicinity of the semiconductor element, which is a source of heat.

Representative, non-limiting examples of the present disclosure will now be described in further detail with reference to the attached drawings. This detailed description is merely intended to teach a person of skill in the art further details for practicing aspects of the present teachings and is not intended to limit the scope of the present disclosure. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the present disclosure in the broadest sense, and are instead taught merely to particularly describe representative examples of the present disclosure. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

With reference to the drawings, a semiconductor device 10 in an embodiment and a method of manufacturing the same will be described. The semiconductor device 10 in the present embodiment can be used for a power conversion circuit such as a converter or an inverter in an electric-powered vehicle such as, for example, an electric vehicle, a hybrid vehicle, or a fuel-cell vehicle. It should be noted that application purposes of the semiconductor device 10 are not limited to a particular one. The semiconductor device 10 can be widely be adopted for various devices and circuits.

Figure 2:
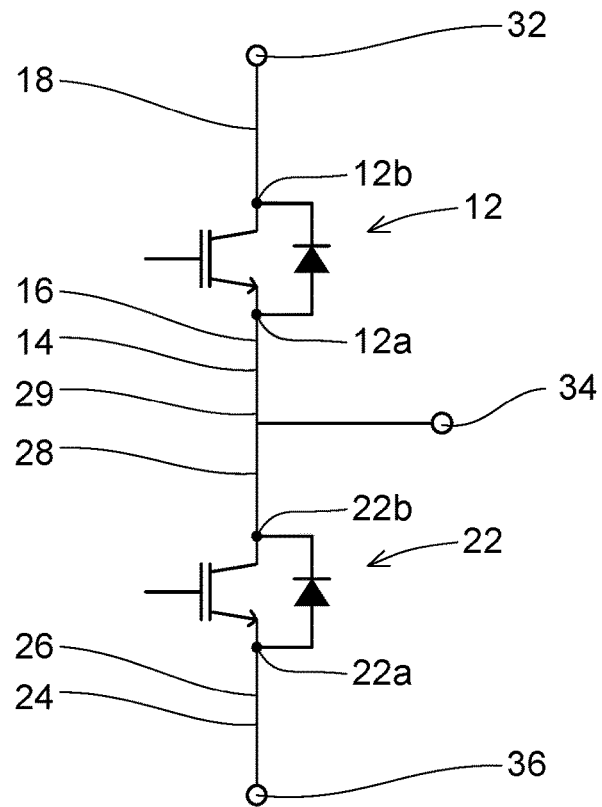
FIG. 2 is a circuit diagram showing an electrical structure of the semiconductor device 10.

As shown in FIGS. 1 and 2, the semiconductor device 10 comprises a first semiconductor element 12, a second semiconductor element 22, and an encapsulant 50 encapsulating the first semiconductor element 12 and the second semiconductor element 22. The encapsulant 50 is constituted of an insulating material, and is constituted of an encapsulating resin such as, for example, an epoxy resin, but is not particularly limited thereto. The semiconductor device 10 further comprises a first power terminal 32, a second power terminal 34, and a third power terminal 36. Each of the power terminals 32, 34, 36 extends both inside and outside the encapsulant 50, and is electrically connected to at least one of the first semiconductor element 12 and the second semiconductor element 22 within the encapsulant 50.

The first semiconductor element 12 includes an upper electrode 12a and a lower electrode 12b. The upper electrode 12a is located on an upper surface of the first semiconductor element 12, and the lower electrode 12b is located on a lower surface of the first semiconductor element 12. In other words, the first semiconductor element 12 is a vertical semiconductor element including a pair of the upper and lower electrodes 12a, 12b. Similarly, the second semiconductor element 22 includes an upper electrode 22a and a lower electrode 22b. The upper electrode 22a is located on an upper surface of the second semiconductor element 22, and the lower electrode 22b is located on a lower surface of the second semiconductor element 22.

In other words, the second semiconductor element 22 is also a vertical semiconductor element including a pair of the upper and lower electrodes 22a, 22b. The first semiconductor element 12 and the second semiconductor element 22 in the present embodiment are semiconductor elements of a same type, and specifically are Reverse Conducting (RC) Insulated Gate Bipolar Transistor (IGBT)s, each of which incorporates an IGBT and a diode.

It should be noted that each of the first semiconductor element 12 and the second semiconductor element 22 is not limited to an RC-IGBT element, and may also be another type of power semiconductor element such as, for example, a Metal-Oxide-Semiconductor Field-Effect Transistor (MOS FET) element. Alternatively, each of the first semiconductor element 12 and the second semiconductor element 22 may be replaced by two or more semiconductor elements such as a diode element and an IGBT element (or a MOSFET element). A specific configuration of each of the first semiconductor element 12 and the second semiconductor element 22 is not limited to a particular one, and various types of semiconductor elements can be adopted. Moreover, each of the first semiconductor element 12 and the second semiconductor element 22 can be constituted of various semiconductor materials such as, for example, silicon (Si), silicon carbide (SiC), or gallium nitride (GaN). An example of the material that can be adopted for constituting the upper electrodes 12a, 22a and the lower electrodes 12b, 22b of the semiconductor elements 12, 22, respectively, includes an aluminum-based metal and/or another metal, but is not particularly limited thereto.

The semiconductor device 10 further comprises a first upper conductor plate 14, a first conductor spacer 16, and a first lower conductor plate 18. These members 14, 16, 18 are constituted of an electrically-conductive material like a metallic material such as, for example, copper or aluminum. The first upper conductor plate 14, the first conductor spacer 16, and the first lower conductor plate 18 each have generally a plate shape, and are placed parallel with one another. The first upper conductor plate 14 and the first lower conductor plate 18 oppose each other via the first semiconductor element 12 and the first conductor spacer 16. Moreover, the first power terminal 32 has a proximal end connected to the first lower conductor plate 18, and a distal end located outside the encapsulant 50.

The first upper conductor plate 14 is joined to the upper electrode 12a of the first semiconductor element 12 via the first conductor spacer 16, and is electrically connected to the upper electrode 12a of the first semiconductor element 12. The first upper conductor plate 14 and the first conductor spacer 16 are joined together by soldering, thereby forming a solder layer 42 between these members 14 and 16. The first conductor spacer 16 and the upper electrode 12a of the first semiconductor element 12 are also joined together by soldering, thereby forming a solder layer 44 between these members 16 and 12. The first lower conductor plate 18 is joined to the lower electrode 12b of the first semiconductor element 12, and is electrically connected to the lower electrode 12b of the first semiconductor element 12. The first lower conductor plate 18 and the lower electrode 12b of the first semiconductor element 12 are soldered, thereby forming a solder layer 46 between these members 12 and 18.

An upper surface of the first upper conductor plate 14 is exposed to an outside at an upper surface 50a of the encapsulant 50, and a lower surface of the first lower conductor plate 18 is exposed to the outside at a lower surface 50b of the encapsulant 50. The first upper conductor plate 14 and the first lower conductor plate 18 thereby not only configure a part of an electric circuit in the semiconductor device 10, but also function as heat-dissipating plates that dissipate heat of the first semiconductor element 12 outside.

The solder layer 42 between the first upper conductor plate 14 and the first conductor spacer 16 contains a plurality of support particles 42a. The plurality of support particles 42a is provided for allowing the solder layer 42 to secure a minimum thickness in soldering between the first upper conductor plate 14 and the first conductor spacer 16. The plurality of support particles 42a is constituted of a material having a higher melting point than the solder layer 42 that contains the support particles 42a, and is in contact with both the first upper conductor plate 14 and the first conductor spacer 16. As an example, in the semiconductor device 10 in the present embodiment, the plurality of support particles 42a is spherical particles constituted of nickel (Ni). Moreover, an alloy mainly constituted of tin (Sn) is adopted for the solder layer 42. It should be noted that the material and shape of the support particles 42a and the material of the solder layer 42 are not limited thereto.

Similarly, the solder layer 44 between the first conductor spacer 16 and the first semiconductor element 12 also contains a plurality of support particles 44a. The plurality of support particles 44a is constituted of a material having a higher melting point than the solder layer 44 that contains the support particles 44a, and is in contact with both the first conductor spacer 16 and the first semiconductor element 12. Moreover, the solder layer 46 between the first semiconductor element 12 and the first lower conductor plate 18 also contains a plurality of support particles 46a. The plurality of support particles 46a is constituted of a material having a higher melting point than the solder layer 46 that contains the support particles 46a, and is in contact with both the first semiconductor element 12 and the first lower conductor plate 18. As an example, in the semiconductor device 10 in the present embodiment, the plurality of support particles 44a, 46a is spherical particles constituted of nickel. Moreover, an alloy mainly constituted of tin (Sn) is adopted for the solder layers 44, 46. It should also be noted that the materials and shapes of these support particles 44a, 46a and the materials of the solder layers 44, 46 are not limited thereto.

The semiconductor device 10 further comprises a second upper conductor plate 24, a second conductor spacer 26, and a second lower conductor plate 28. These members 24, 26, 28 are constituted of an electrically-conductive material like a metallic material such as, for example, copper or aluminum. The second upper conductor plate 24, the second conductor spacer 26, and the second lower conductor plate 28 each have a generally plate shape, and are placed parallel with one another. The second upper conductor plate 24 and the second lower conductor plate 28 oppose each other via the second semiconductor element 22 and the second conductor spacer 26. The third power terminal 36 has a proximal end connected to the second. upper conductor plate 24, and has a distal end thereof located outside the encapsulant 50. The second power terminal 34 has a proximal end thereof connected to the second lower conductor plate 28, and has a distal end thereof located outside the encapsulant 50.

The second upper conductor plate 24 is joined to the upper electrode 22a of the second semiconductor element 22 via the second conductor spacer 26, and is electrically connected to the upper electrode 22a of the second semiconductor element 22. The second upper conductor plate 24 and the second conductor spacer 26 are joined together by soldering, thereby forming a solder layer 52 between these members 24 and 26. The second conductor spacer 26 and the upper electrode 22a of the second semiconductor element 22 are also joined together by soldering, thereby forming a solder layer 54 between these members 26 and 22. The second lower conductor plate 28 is joined to the lower electrode 22b of the second semiconductor element 22, and is electrically connected to the lower electrode 22b of the second semiconductor element 22. The second lower conductor plate 28 and the lower electrode 22b of the second semiconductor element 22 are joined together by soldering, thereby forming a solder layer 56 between these members 22 and 28.

An upper surface of the second upper conductor plate 24 is exposed to outside at the upper surface 50a of the encapsulant 50, and a lower surface of the second lower conductor plate 28 is exposed to outside at the lower surface 50b of the encapsulant 50. The second upper conductor plate 24 and the second lower conductor plate 28 thereby not only configure a part of the electric circuit in the semiconductor device 10, but also function as heat-dissipating plates that dissipate heat of the second semiconductor element 22 to outside.

The solder layer 52 between the second upper conductor plate 24 and the second conductor spacer 26 contains a plurality of support particles 52a as in the solder layers 42, 44, 46 in the first semiconductor element 12 mentioned before. The plurality of support particles 52a is constituted of a material having a higher melting point than the solder layer 52 that contains the support particles 52a, and is in contact with both the second upper conductor plate 24 and the second conductor spacer 26. Similarly, the solder layer 54 between the second conductor spacer 26 and the second semiconductor element 22 also contains a plurality of support particles 54a. The plurality of support particles 54a is constituted of a material having a higher melting point than the solder layer 54 that contains the support particles 54a, and is in contact with both the second conductor spacer 26 and the second semiconductor element 22. Moreover, the solder layer 56 between the second semiconductor element 22 and the second lower conductor plate 28 also contains a plurality of support particles 56a, The plurality of support particles 56a is constituted of a material having a higher melting point than the solder layer 56 that contains the support particles 56a, and is in contact with both the second semiconductor element 22 and the second lower conductor plate 28. As an example, in the semiconductor device 10 in the present embodiment, the pluralities of support particles 52a, 54a, 56a each is spherical particles constituted of nickel. Moreover, an alloy mainly constituted of tin (Sn) is adopted for the solder layers 52, 54, 56. It should be noted that the materials and shapes of these support particles 52a, 54a, 56a and the materials of the solder layers 52, 54, 56 are not limited thereto.

The semiconductor device 10 further includes a connector portion 29. The connector portion 29 is located within the encapsulant 50, and connects the first upper conductor plate 14 and the second lower conductor plate 28 to each other. The connector portion 29 in the present embodiment is formed integrally with the second lower conductor plate 28, but such configuration is not limiting. The connector portion 29 extends from the second lower conductor plate 2$ toward the first upper conductor plate 14, and is joined to the first upper conductor plate 14 at its distal end. The first upper conductor plate 14 and the connector portion 29 are joined together by soldering, thereby forming a solder layer 48 between these members 14 and 29. Here, the solder layer 48 between the first upper conductor plate 14 and the connector portion 29 does not contain any support particles as mentioned before. Therefore, in soldering between the first upper conductor plate 14 and the connector portion 29, a distance between the first upper conductor plate 14 and the connector portion 29, in other words, a thickness of the solder layer 48 can relatively freely vary.

Figure 3:
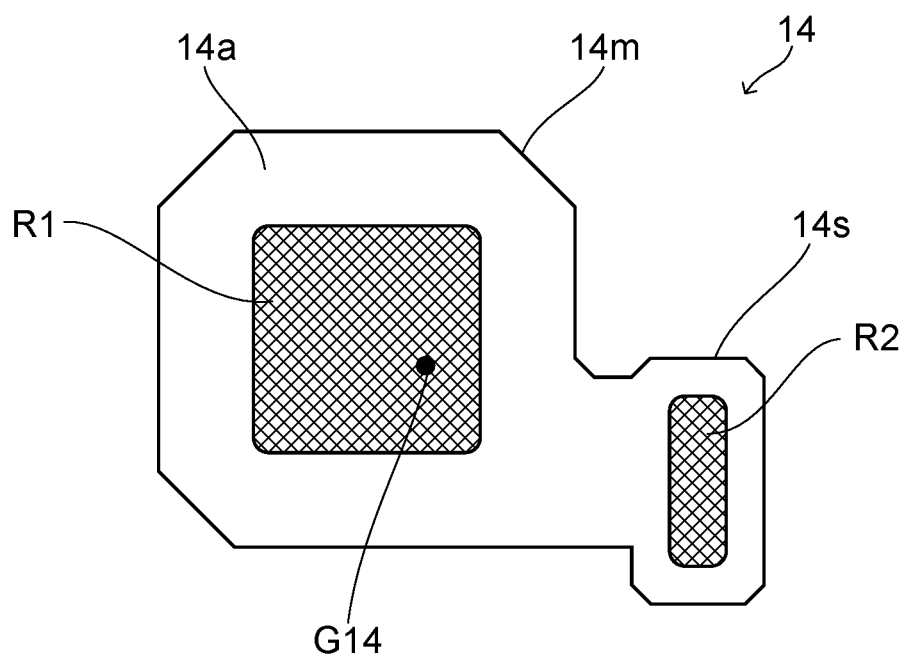
FIG. 3 is a diagram showing a first upper conductor plate 14 from its lower surface 14a side.

As is understood from the description above, in the semiconductor device 10 in the present embodiment, two members, namely, the first conductor spacer 16 and the connector portion 29 are joined by soldering to the first upper conductor plate 14 at a lower surface 14a side. Therefore, as shown in FIG. 3, the lower surface 14a of the first upper conductor plate 14 includes a first region R1 to which the first conductor spacer 16 is joined, and a second region R2 to which the connector portion 29 is joined. As an example, the first upper conductor plate 14 in the present embodiment includes a main part 14m where the first region R1 is provided, and a connecting part 14s where the second region R2 is provided, and the connecting part 14s is thinner than the main part 14m.

The solder layer 42, which is located between the first upper conductor plate 14 and the first conductor spacer 16, makes contact with the first region R1, and the solder layer 48, which is located between the first upper conductor plate 14 and the connector portion 29, makes contact with the second region R2. Here, the solder layer 42 between the first upper conductor plate 14 and the first conductor spacer 16 contains the plurality of support particles 42a, However, the solder layer 48 between the first upper conductor plate 14 and the connector portion 29 does not contain such support particles. This is a feature derived from a method of manufacturing a semiconductor device 10, which method is an aspect of the present technology. This will be described in details later.

In other words, the first upper conductor plate 14 in the present embodiment is an example of a first member in the present technology. Similarly, the first conductor spacer 16 is an example of a second member in the present technology, and the connector portion 29 is an example of a third member in the present technology. Moreover, the solder layer 42 located between the first upper conductor plate 14 and the first conductor spacer 16 is an example of a first solder layer in the present technology, the solder layer 48 located between the first upper conductor plate 14 and the connector portion 29 is an example of a second solder layer in the present technology, and the solder layer 44 located between the first conductor spacer 16 and the first semiconductor element 12 is an example of a third solder layer in the present technology. The solder layers 42, 48, 44 may hereinafter be termed a first solder layer 42, a second solder layer 48, and a third solder layer 44, respectively.

Additionally, in the semiconductor device 10 in the present embodiment, an area of the first region R1 where the first solder layer 42 is in contact with the first upper conductor plate 14 is greater than an area of the second region. R2 Where the second solder layer 48 is in contact with the first upper conductor plate 14. Moreover, in a view perpendicular to the first region R1, a center of gravity G14 of the first upper conductor plate 14 is located within the first region R1. Furthermore, both the first region R1 and the second region R2 are located on the lower surface 14a of the first upper conductor plate 14, and a normal vector of the first region R1 is parallel with a normal vector of the second region R2. These features are also derived from the method of manufacturing a semiconductor device 10, which method will be described below, or have technological significance in the manufacturing method.

Figure 4:
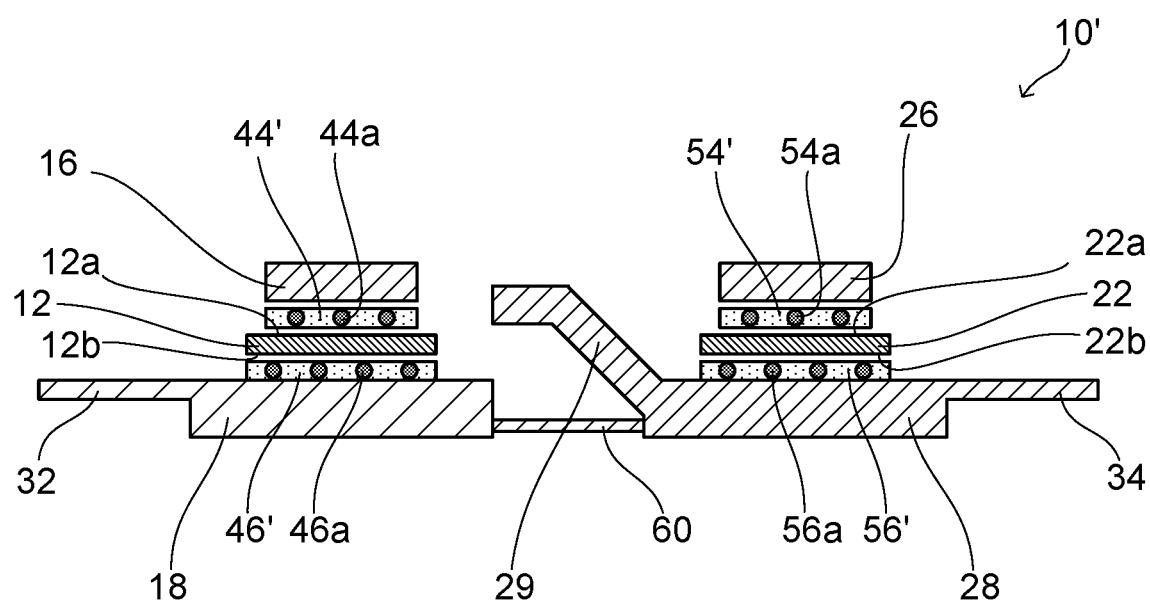
FIG. 4 is a diagram showing a first soldering step, Which is a step of a method of manufacturing a semiconductor device 10.
Figure 5:
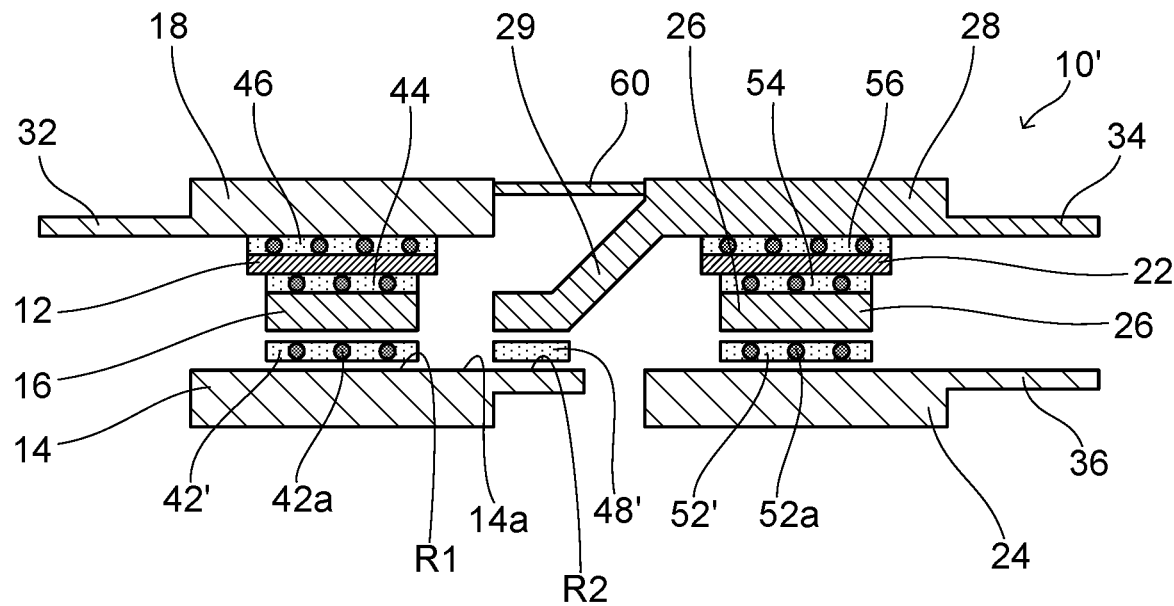
FIG. 5 is a diagram showing a second soldering step, which is a step of the method of manufacturing a semiconductor device 10.
Figure 6:
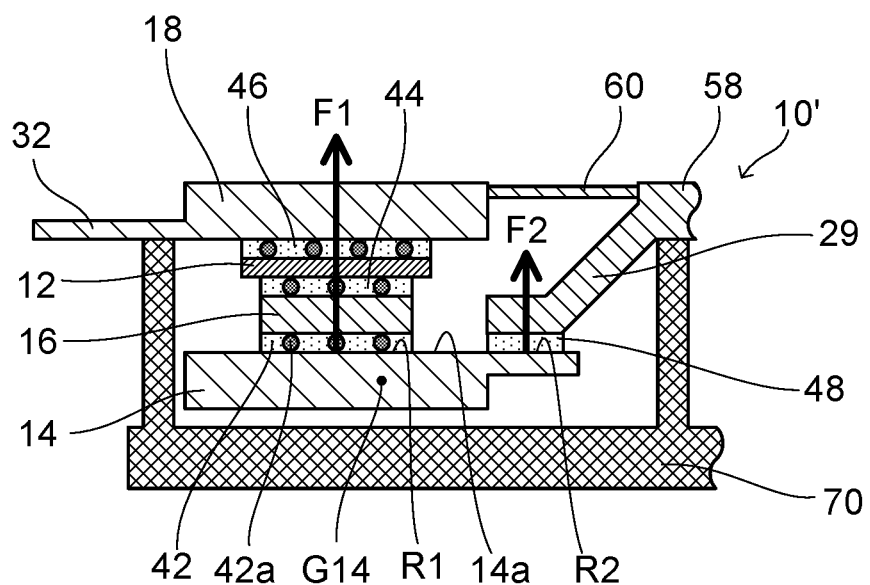
FIG. 6 is a diagram showing a behavior of the first upper conductor plate 14 in the second soldering step.

Next, with reference to FIGS. 4 to 6, a method of manufacturing a semiconductor device 10 will be described. This manufacturing method mainly comprises a first soldering step shown in FIG. 4, and a second soldering step shown in FIGS. 5 and 6. In the first soldering step, a first semiconductor element 12 and a first conductor spacer 16 are soldered onto a first lower conductor plate 18, and a second semiconductor element 22 and a second conductor spacer 26 are soldered onto a second lower conductor plate 28. A specific manner of the first soldering step is not limited to a particular one.

As an example, in the manufacturing method in the present embodiment, firstly the first semiconductor element 12 is placed above the first lower conductor plate 18 via a solder material 46', and the first conductor spacer 16 is placed above the first semiconductor element 12 via a solder material 44'. These solder materials 44', 46' respectively contain pluralities of support particles 44a, 46a. Moreover, the second semiconductor element 22 is placed above the second lower conductor plate 28 via a solder material 56', and the second conductor spacer 26 is placed above the second semiconductor element 22 via a solder material 54'. These solder materials 54', 56' also respectively contain pluralities of support particles 54a, 56a. At this stage, each of the first lower conductor plate 18 and the second lower conductor plate 28 is prepared in the form of a single lead frame, and these conductor plates 18, 28 are coupled to each other via a tie bar 60.

Successively, an assembly 10' prepared as described above is heated in a reflow furnace so as to melt the solder materials 44', 46', 54', 56'. At this occasion, each of the solder materials 44', 46', 54', 56' is maintained to have a certain thickness with desired dimensions, respectively by the support particles 44a, 46a, 54a, 56a contained in the solder materials 44', 46', 54', 56', respectively. The solder materials 44', 46', 54', 56' are melted over a predetermined time, and then heat is removed from the assembly 10'. The solder materials 44', 46', 54', 56' are solidified again to be the solder layers 44, 46, 54, 56 in the semiconductor device 10.

Next, the second soldering step is performed. As shown in FIG. 5, in the second soldering step, the first upper conductor plate 14 and the second upper conductor plate 24 are soldered to the assembly 10' that has undergone the first soldering step. A specific manner of the second soldering step is not limited to particular one. As an example, initially in the second soldering step in the present embodiment, the first upper conductor plate 14 and the second upper conductor plate 24 are placed in a vertically-flipped orientation. In other words, in the second soldering step, a lower surface 14a of the first upper conductor plate 14 is oriented upward. Successively, the assembly 10' that has undergone the first soldering step is placed, in a vertically flipped orientation, above the first upper conductor plate 14 and the second upper conductor plate 24 via the solder materials 42', 48', 52'. At this occasion, on the lower surface 14a of the first upper conductor plate 14, the first conductor spacer 16 is placed above a first region R1 via the solder material 42', and a connector portion 29 is placed above a second region R2 via the solder material 48'. As shown in FIG. 6, the assembly 10' may be supported by using a jig 70.

Here, the solder material 42' between the first upper conductor plate 14 and the first conductor spacer 16 contains a plurality of support particles 42a mentioned before. Contrary to this, the solder material 48' between the first upper conductor plate 14 and the connector portion 29 does not contain such support particles. In other words, the former solder material 42' is an example of a first solder material in the present technology, and the latter solder material 42' is an example of a second solder material in the present technology. These solder materials 42', 48' may hereinafter be termed a first solder material 42' and a second solder material 48', respectively. Notably, a specific configuration of each of the first solder material 42' and the second solder material 48' is not limited to particular one, Each of these solder materials 42', 48' may be, for example, a sheet-like solder material or a paste-like or slurry-like solder material.

Next, the reflow furnace is used again to melt the solder materials 42', 48', 52'. As shown in FIG. 6, when the solder materials 42', 48', 52' are melted, the first upper conductor plate 14 is attracted to the first conductor spacer 16 and the connector portion 29 by surface tensions F1, F2 of the melted first solder material 42' and the melted second solder material 48', respectively. It should be noted that the first solder material 42' contains the plurality of support particles 42a, and the plurality of support particles 42a makes contact with both the first upper conductor plate 14 and the first conductor spacer 16. The thickness of the first solder material 42' is thereby maintained.

On the other hand, the second solder material 48' does not contain such support particles. Therefore, if any of the first upper conductor plate 14, the first conductor spacer 16, and the connector portion 29 has dimensional or positional deviation, the thickness of the second solder material 48' varies in accordance with the deviation. The first upper conductor plate 14 is thereby joined, not tilting but in a correct posture, to the first conductor spacer 16 and the connector portion 29. Therefore, not only the first solder layer 42 between the first upper conductor plate 14 and the first conductor spacer 16, but also the second solder layer 4$ between the first upper conductor plate 14 and the connector portion 29, are maintained to have a relatively uniform thickness.

As mentioned before, the area of the first region R1 where the first solder material 42' is in contact with the first upper conductor plate 14 is greater than the area of the second region R2 where the second solder material 48' is in contact with the first upper conductor plate 14. According to such a configuration, the surface tension F1 of the melted first solder material 42' attracts the first upper conductor plate 14 more strongly than the surface tension F2 of the melted second solder material 48' does. Since the first solder material 42' contains the plurality of support particles 42a, the first solder material 42' strongly attracts the first upper conductor plate 14, so that the posture of the first upper conductor plate 14 is more easily stabilized.

In the manufacturing method in the present embodiment, in the second soldering step, in a view perpendicular to the first region R1, the center of gravity G14 of the first upper conductor plate 14 is located within the first region R1. According to such a configuration, when the melted first solder material 42' and the melted second solder material 48' attract the first upper conductor plate 14, the plurality of support particles 42a contained in the first solder material 42' makes contact with the first upper conductor plate 14 near that center of gravity G14, so that the posture of the first upper conductor plate 14 is more easily stabilized.

What is claimed is:

1. A semiconductor device in which a plurality of members including a semiconductor element are joined together via solder layers, the semiconductor device comprising:
   a first member;
   a second member joined to a first region of the first member via a first solder layer, the first region being located on a first side of the first member; and
   a third member joined to a second region of the first member via a second solder layer, the second region being located on the first side of the first member,
   wherein
   the first solder layer contains a plurality of support particles that is constituted of a material having a higher melting point than the first solder layer, and
   the second solder layer does not contain any support particles.

2. The semiconductor device according to claim 1, wherein each of the plurality of support particles is in contact with both the first member and the second member.

3. The semiconductor device according to claim 1, wherein an area of the first region is greater than an area of the second region.

4. The semiconductor device according to claim 1, wherein, in a view perpendicular to a surface of the first region that is in contact with the first solder layer, a center of gravity of the first member is located within the first region.

5. The semiconductor device according to claim 1, wherein a normal vector of a surface of the first region that is in contact with the first solder layer is parallel with a normal vector of a surface of the second region that is in contact with the second solder layer.

6. The semiconductor device according to claim 1, wherein the plurality of support particles is constituted of a metallic material.

7. The semiconductor device according to claim 6, wherein the plurality of support particles is constituted of nickel (Ni) or copper (Cu).

8. The semiconductor device according to claim 1, wherein
   the semiconductor element is joined to the second member via a third solder layer at an opposite side from the first solder layer, and
   the third solder layer contains a plurality of second support particles that is constituted of a material having a higher melting point than the third solder layer.

9. A method of manufacturing a semiconductor device in which a plurality of members including a semiconductor element are joined together via solder layers, the method comprising:
   placing a second member above a first region of a first member via a first solder material and placing a third member above a second region of the first member via a second solder material, the first region and the second region being located on a first side of the first member; and
   soldering the second member and the third member to the first side of the first member by melting the first solder material and the second solder material,
   wherein
   the first solder material contains a plurality of support particles that is constituted of material having a higher melting point than the first solder material, and
   the second solder material does not contain any support particles.

10. The method according to claim 9, wherein, in the soldering of the second member and the third member, the first member is attracted to the second member and the third member by surface tensions of the melted first solder material and the melted second solder material such that each of the plurality of support particles makes contact with both the first member and the second member.

* * * * *